US007400690B2

United States Patent
Sun et al.

(10) Patent No.: US 7,400,690 B2
(45) Date of Patent: Jul. 15, 2008

(54) ADAPTIVE PHASE CONTROLLER, METHOD OF CONTROLLING A PHASE AND TRANSMITTER EMPLOYING THE SAME

(75) Inventors: Yanling Sun, De Meern (NL); Xiao-Jiao Tao, Losser (NL)

(73) Assignee: Agere Systems Inc., Allentown, PA (US)

( * ) Notice: Subject to any disclaimer, the term of this patent is extended or adjusted under 35 U.S.C. 154(b) by 730 days.

(21) Appl. No.: 10/685,018

(22) Filed: Oct. 14, 2003

(65) Prior Publication Data

US 2005/0078768 A1 Apr. 14, 2005

(51) Int. Cl.
*H04K 1/02* (2006.01)

(52) U.S. Cl. ........................ 375/297; 375/376; 375/326; 375/374; 370/350; 370/355; 455/84; 455/126

(58) Field of Classification Search ................. 375/297, 375/120, 376, 326, 374; 455/84, 126; 370/355, 370/350
See application file for complete search history.

(56) References Cited

U.S. PATENT DOCUMENTS

| | | | | | |
|---|---|---|---|---|---|
| 5,313,503 | A | * | 5/1994 | Jones et al. | .................. 375/376 |
| 5,463,627 | A | * | 10/1995 | Matsuoka et al. | ........... 370/350 |
| 5,802,451 | A | * | 9/1998 | Adachi et al. | ................ 455/126 |
| 5,986,485 | A | * | 11/1999 | O'Sullivan | .................. 327/156 |
| 5,991,350 | A | * | 11/1999 | Yamamoto | .................. 375/376 |
| 2002/0041215 | A1 | * | 4/2002 | Kiyose | ........................ 331/57 |
| 2003/0203720 | A1 | * | 10/2003 | Oosawa et al. | ................ 455/84 |

OTHER PUBLICATIONS

Joel L. Dawson "Automatic Phase Alignment for High Bandwidth Cartesian Feedback Power Amplifiers" IEEE; 2000; pp. 71-74.
Inventor: Erik B. Busking; U.S. Appl. No. 10/442,623 entitled "A Vector Monitor, Related Method of Controlling a Transmitter Employing the Same" filed May 21, 2003.
Inventors: Yanling Sun and Erik B. Busking; U.S. Appl. No. 10/159,651 entitled "Group Delay Precompensator for Broadband Radio Frequency Transmitter and Method of Operating the Same" filed May 31, 2002.

* cited by examiner

*Primary Examiner*—Chieh M. Fan
*Assistant Examiner*—Eva Puente

(57) ABSTRACT

The present invention is directed to an adaptive phase controller employing a threshold level and a method of controlling a phase. In one embodiment, the adaptive phase controller includes a comparator configured to receive a comparison signal representing a phase and to provide a vernier signal based on comparing first and second samples of the comparison signal when the comparison signal is below the threshold level. Additionally, the adaptive phase controller also includes an adder/decoder coupled to the comparator and configured to adjust a current number corresponding to the phase based on the vernier signal.

15 Claims, 5 Drawing Sheets

ADAPTIVE PHASE CONTROLLER, METHOD OF CONTROLLING A PHASE AND TRANSMITTER EMPLOYING THE SAME

TECHNICAL FIELD OF THE INVENTION

The present invention is directed, in general, to wireless communication systems and, more specifically, to an adaptive phase controller, a method of controlling a phase and a transmitter employing the same.

BACKGROUND OF THE INVENTION

The recent growth of high-speed telecommunications has placed increasing demand for more signal bandwidth. While attempting to augment the available bandwidth of channels within a given transmission frequency range (e.g., 2.5 to five gigahertz range), the combined use of amplitude and phase modulation, such as may be found with orthogonal frequency division multiplexing (OFDM), has proven difficult to implement in practical applications.

More specifically, the delivery of improved spectral efficiency of transmitted signals in linear modulation schemes typically undergoes significant distortion of both phase and amplitude when the modulated signals are boosted by a power amplifier for transmission to a receiver. The distortion is especially prevalent in transmitters that employ power efficient, but nonlinear, radio frequency (RF) power amplifiers. As a result, linearization techniques have been developed to produce a desirable trade-off between a transmitter's efficiency and its linearity.

Cartesian feedback may be employed as a linearization technique for reducing distortion in a transmitter system. Cartesian feedback linearization compares in-phase and quadrature phase baseband input signals with distorted in-phase and quadrature phase baseband feedback signals that are usually demodulated from the RF power amplifier output. To provide a reliable comparison between the in-phase and quadrature phase input and feedback signals, their respective components must be substantially in phase. In many important cases, there is an unacceptably large phase difference between the in-phase and feedback signals due to feedback loop delay, which may include both RF delay (or propagation delay) and baseband delay. This typically results in crosstalk between the in-phase and quadrature phase feedback signals.

Propagation delay dominates the phase characteristics at RF and provides a maximum limit to the unit loop gain bandwidth. This propagation delay, which is introduced mainly by the power amplifier, usually varies with frequency and power level. To synchronize the baseband and feedback signals, a phase adjuster or a phase shifter is necessary to reduce the average phase shift. Adjustment of this phase shifter may be accomplished by a phase-alignment control block or phase controller.

It is not unusual for the phase controller to be required to accommodate a phase shift ranging from zero to 360° to compensate for phase adequately. This attribute makes implementation of the phase controller quite difficult, since overall performance of the transmitter is extraordinarily sensitive to the phase of the feedback signals.

Accordingly, what is needed in the art is a way to effectively control a phase adjustment associated with a transmitter employing Cartesian input and feedback signals that reduces feedback loop error and distortion associated with power amplification.

SUMMARY OF THE INVENTION

To address the above-discussed deficiencies of the prior art, the present invention is directed to an adaptive phase controller employing a threshold level. In one embodiment, the adaptive phase controller includes a comparator configured to receive a comparison signal representing a phase and to provide a vernier signal based on comparing first and second samples of the comparison signal when the comparison signal is below the threshold level. Additionally, the adaptive phase controller also includes an adder/decoder coupled to the comparator and configured to adjust a current number corresponding to the phase based on the vernier signal.

In another aspect, the present invention provides a method of controlling a phase employing a threshold level. The method includes receiving a comparison signal and providing a vernier signal based on comparing first and second samples of the comparison signal when the comparison signal is below the threshold level. The method also includes adjusting a current number corresponding to the phase based on the vernier signal.

The present invention also provides, in yet another aspect, a transmitter that includes an input section that receives in-phase and quadrature phase input and feedback signals and provides in-phase and quadrature phase output signals. The transmitter also includes a feedback section that provides in-phase and quadrature phase feedback signals to the input section, and a power amplifier that is coupled to the input and feedback sections. The transmitter further includes a local oscillator section that is coupled to the feedback section, and a digitally controlled phase shifter that is coupled to the output of the local oscillator sections. The transmitter still further includes an adaptive phase controller that employs a threshold level and is coupled to the digitally controlled phase shifter.

The adaptive phase controller includes a comparator that receives a comparison signal representing a phase and provides a vernier signal based on comparing first and second samples of the comparison signal when the comparison signal is below the threshold level. The adaptive phase controller further includes an adder/decoder, coupled to the comparator, that adjusts a current number corresponding to the phase based on the vernier signal.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
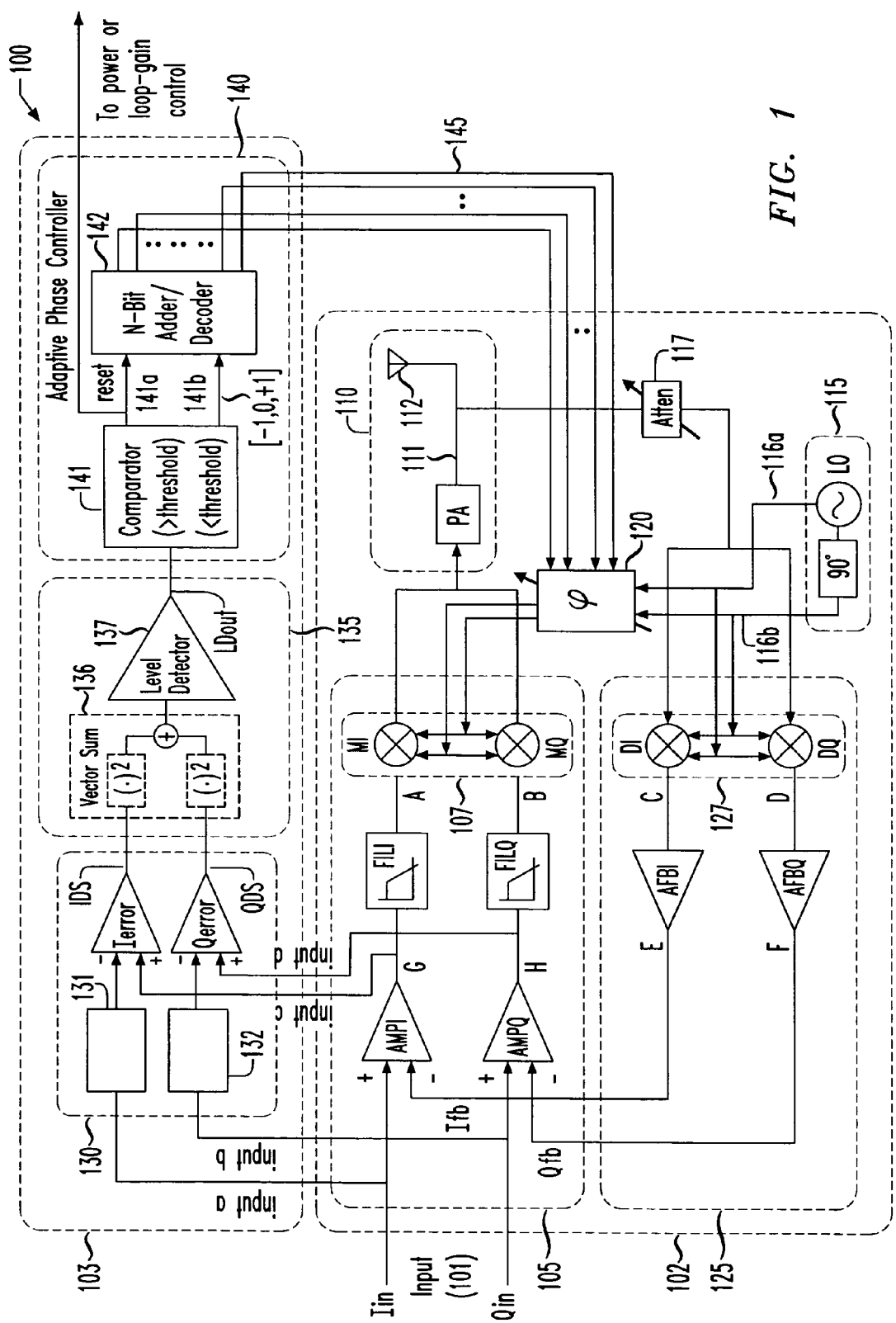
FIG. 1 illustrates a system diagram of an embodiment of a transmitter that includes an embodiment of an adaptive phase controller employed in an implementation of distortion extraction and constructed in accordance with the principles of the present invention.

Referring initially to FIG. 1, illustrated is a system diagram of an embodiment of a transmitter, generally designated 100, that includes an embodiment of an adaptive phase controller 140 employed in an implementation of distortion extraction and constructed in accordance with the principles of the present invention. The transmitter 100 employs in-phase and quadrature phase (Cartesian) input and feedback signals (wherein both may be referred to as in-phase and quadrature phase signals) and includes a transmit portion 102 and a distortion extracting portion 103.

The transmit portion 102 includes an input section 105 having an input 101 that employs in-phase and quadrature phase baseband input signals Iin, Qin, respectively, a power amplifier section 110 having a transmit output 111 that transmits a baseband-modulated RF output signal and a feedback section 125 that returns in-phase and quadrature phase baseband feedback signals Ifb, Qfb to the input section 105. The transmit portion 102 further includes a local oscillator section 115 that provides in-phase and quadrature phase RF carrier signals, a digitally controlled phase shifter 120 that provides phase-shifted RF carrier signals and a feedback attenuator 117 that provides a portion of the RF output signal on the transmit output 111 to the feedback section 125.

The distortion extracting portion 103 includes a distortion extracting section 130 that provides in-phase and quadrature phase distortion signal components IDS, QDS, respectively, a level detecting section 135 that provides an output LDout proportional to the magnitude of associated error components and the adaptive phase controller 140 that provides a phase control signal 145 to the digitally controlled phase shifter 120.

The input section 105 includes in-phase and quadrature phase input amplifiers AMPI, AMPQ, in-phase and quadrature phase lowpass filters FILI, FILQ and an in-phase/quadrature phase (I/Q) modulator 107. The I/Q modulator 107 includes in-phase and quadrature phase modulator sections MI, MQ, respectively, coupled to the digitally controlled phase shifter 120. The in-phase input amplifier AMPI receives the in-phase input and feedback baseband signals Iin, Ifb and provides an in-phase amplifier output signal at a node G, which is a difference between these two signals, to the in-phase filter FILI. The output of the in-phase filter FILI is provided at a node A to the in-phase modulator section MI. Similarly, the quadrature phase input amplifier AMPQ receives the quadrature phase input and feedback baseband signals Qin, Qfb and provides a quadrature phase amplifier output signal at a node H, which is a difference between these two signals, to the quadrature phase filter FILQ. The output of the quadrature phase filter FILQ is provided at a node B to the quadrature phase modulator section MQ.

The power amplifier section 110 includes a power amplifier PA whose transmit output 111 is coupled to a transmit antenna 112. In-phase and quadrature phase baseband-modulated RF output signals from the I/Q modulator 107 are provided to the power amplifier PA for subsequent amplification and transmission employing the transmit antenna 112. As stated earlier, the feedback attenuator 117 provides a portion of the RF signal on the transmit output 111 to the feedback section 125. As indicated in FIG. 1, the feedback attenuator 117 may be adjusted to provide a required input value of this RF signal to the feedback section 125.

The feedback section 125 includes an in-phase/quadrature phase (I/Q) demodulator 127 having in-phase and quadrature phase demodulator sections DI, DQ that are coupled to in-phase and quadrature phase feedback amplifiers ABFI, ABFQ, respectively. The in-phase and quadrature phase demodulator sections DI, DQ are also coupled to the local oscillator section 115 and receive the attenuated RF signal from the transmit output 111.

The local oscillator section 115 includes a local oscillator LO having an in-phase output 116a and a quadrature phase output 116b. Using these local oscillator outputs, demodulated in-phase and quadrature phase baseband feedback signals are provided at nodes C and D, to the in-phase and quadrature phase feedback amplifiers AFBI, AFBQ, respectively. Amplified in-phase and quadrature phase baseband feedback signals Ifb, Qfb are provided at nodes E and F to their respective input amplifiers AMPI, AMPQ.

In the illustrated embodiment, the distortion extracting section 130 employs inputs a, b, c, d and includes an in-phase scaling factor 131 coupled to an in-phase distortion extracting amplifier Ierror and a quadrature phase scaling factor 132 coupled to a quadrature phase distortion extracting amplifier Qerror. The inputs a and b are coupled from the in-phase and quadrature phase input signals Iin, Qin, respectively. Similarly, the inputs c and d are coupled to the nodes G and H, respectively. Additionally, the in-phase and quadrature phase distortion extracting amplifiers Ierror, Qerror provide the in-phase and quadrature phase distortion components IDS, QDS to the level detecting section 135. The distortion extracting section 130 detects the distortion signal produced by a non-linearity of the power amplifier PA under the influence of a finite loop gain. This extracted distortion is monitored and then employed to direct phase adjustments. In an alternative embodiment to be discussed subsequently, phase adjustments will be directed toward errors indicated by the nonlinearity of the power amplifier PA.

Due to the feedback error introduced by the nonlinearity of the power amplifier PA and the finite loop gain, the outputs of the in-phase and quadrature phase input amplifiers AMPI, AMPQ contain not only a wanted baseband signal but also a distortion signal having a wider spectrum than that of the original input baseband signals. To extract only the distortion signal, the wanted baseband signal should be attenuated and preferably removed. This may be done by providing both the output signals of the in-phase and quadrature phase input amplifiers AMPI, AMPQ and the original baseband in-phase and quadrature phase input signals Iin, Qin into the in-phase and quadrature phase distortion extracting amplifiers Ierror, Qerror, as shown.

To remove substantially the in-phase and quadrature phase baseband input signals Iin, Qin, their amplitude needs to be scaled and their phase characteristics must duplicate that of the input amplifiers AMPI, AMPQ. The in-phase and quadrature phase scaling factors 131, 132 accomplish this action such that the in-phase and quadrature phase distortion extracting amplifiers Ierror, Qerror may then subtract the in-phase and quadrature phase input baseband signals Iin, Qin from the outputs of input amplifiers AMPI, AMPQ. As a result, only the in-phase and quadrature phase distortion components IDS, QDS remain, which represent the distortion produced primarily by the power amplifier PA.

The level detecting section 135 includes a vector summation circuit 136 and a level detector 137. The vector summation circuit 136 includes in-phase and quadrature phase input squaring circuits with outputs that are summed and provided to the level detector 137. The level detector 137 is a logarithmic amplifier, in the illustrated embodiment. The vector summation circuit 136 provides a polar summation, that may be expressed by $[(IDS)^2+(QDS)^2]$, to the logarithmic level detector 137. The level detector 137 then correspondingly provides the output LDout, which is a logarithmic DC voltage proportional to the distortion from the power amplifier PA, to the adaptive phase controller 140.

The adaptive phase controller 140 includes a comparator 141 and an N-bit adder/decoder 142 having a phase control signal 145 coupled to the digitally controlled phase shifter 120. The comparator 141 employs a threshold level TL. When the output LDout, which represents a phase associated with the digitally controlled phase shifter 120, provides a DC voltage comparison signal at a time t (i.e., a comparison signal $DC_t$) that is equal to or greater than the threshold level TL, a reset signal 141a is asserted that indicates the transmitter 100 is in an abnormal work status. Assertion of the reset signal 141a resets the N-bit adder/decoder 142 to a reset number by increasing a phase search step until the comparison signal $DC_t$ is less than the threshold level TL. The exact value of the reset number may be determined empirically. Alternatively, design considerations may recommend a desirable value for the reset number.

When the comparison signal $DC_t$ is less than the threshold level TL, the comparator 141 saves the comparison signal $DC_t$ as a first sample and compares it with a comparison signal $DC_{t+1}$, which is a second sample of the DC voltage comparison signal at a time (t+1). If the comparison signal $DC_t$ is greater than the comparison signal $DC_{t+1}$, the comparator 141 provides a vernier signal 141b having a value of positive one (+1) to the N-bit adder/decoder 142, wherein its current number is incremented. If the comparison signal $DC_t$ is less than the comparison signal $DC_{t+1}$, the comparator 141 provides a vernier signal 141b having a value of negative one (−1) to the N-bit adder/decoder 142, wherein its current number is decremented. If the comparison signal $DC_t$ is equal to the comparison signal $DC_{t+1}$, the comparator 141 provides a vernier signal 141b having a value of zero (0) to the N-bit adder/decoder 142, wherein it maintains its current number. This action provides a fine phase adjust procedure using relatively small phase search steps.

The N-bit adder/decoder 142 provides an N-bit wide phase control signal 145 to the digitally controlled phase shifter 120. The number N is chosen to provide a phase resolution that is needed by the transmitter 100 to meet its performance requirements. In the illustrated embodiment, the I/Q demodulator 127 provides a direct conversion to the baseband signal without employing an intermediate frequency (i.e., a zero IF conversion). Additionally, the phase shift introduced by the I/Q demodulator 127 and other baseband elements in the feedback section 125 is negligible.

In a first alternative embodiment employing the distortion extracting portion 103, the input lines a, b, c, d are moved to the nodes A, B, C, D respectively. This arrangement allows the inputs to the distortion extracting section 130 to be re-scaled, which provides elimination of unwanted signals and baseband phase while measuring the distortion from the power amplifier PA.

In a second alternative embodiment employing the distortion extracting portion 103, the input lines c, d are moved to the nodes E, F, respectively and the amplitudes associated with the in-phase and quadrature phase scaling factors 131, 132 are re-scaled. This connection of the input lines c, d does not need to compensate for phase shifts associated with the in-phase and quadrature phase input amplifiers AMPI, AMPQ. This alternative embodiment also measures the distortion produced by the power amplifier PA.

In a third alternative embodiment employing the distortion extracting portion 103, the level detector 135 may employ two frequency passbands or be modified to incorporate two level detectors with different frequency passbands. A first frequency passband employs a bandwidth that is several times the baseband frequency bandwidth. A second frequency passband employs a bandwidth that accommodates noise peaking frequencies, which often occur at a time when a rapid phase adjustment is required. The output of the first frequency passband is coupled to a portion of the comparator 141 for a comparison signal that is less than the threshold level TL wherein an appropriate vernier signal 141b is provided to the N-bit adder/decoder 142. Correspondingly, the output of the second frequency passband is coupled to a portion of the comparator 141 for a comparison signal that is greater than the threshold level TL wherein the reset signal 141a may be provided to the N-bit adder/decoder 142, as appropriate. This arrangement typically allows a faster response time for distortion detection and phase adjustment.

Figure 2:
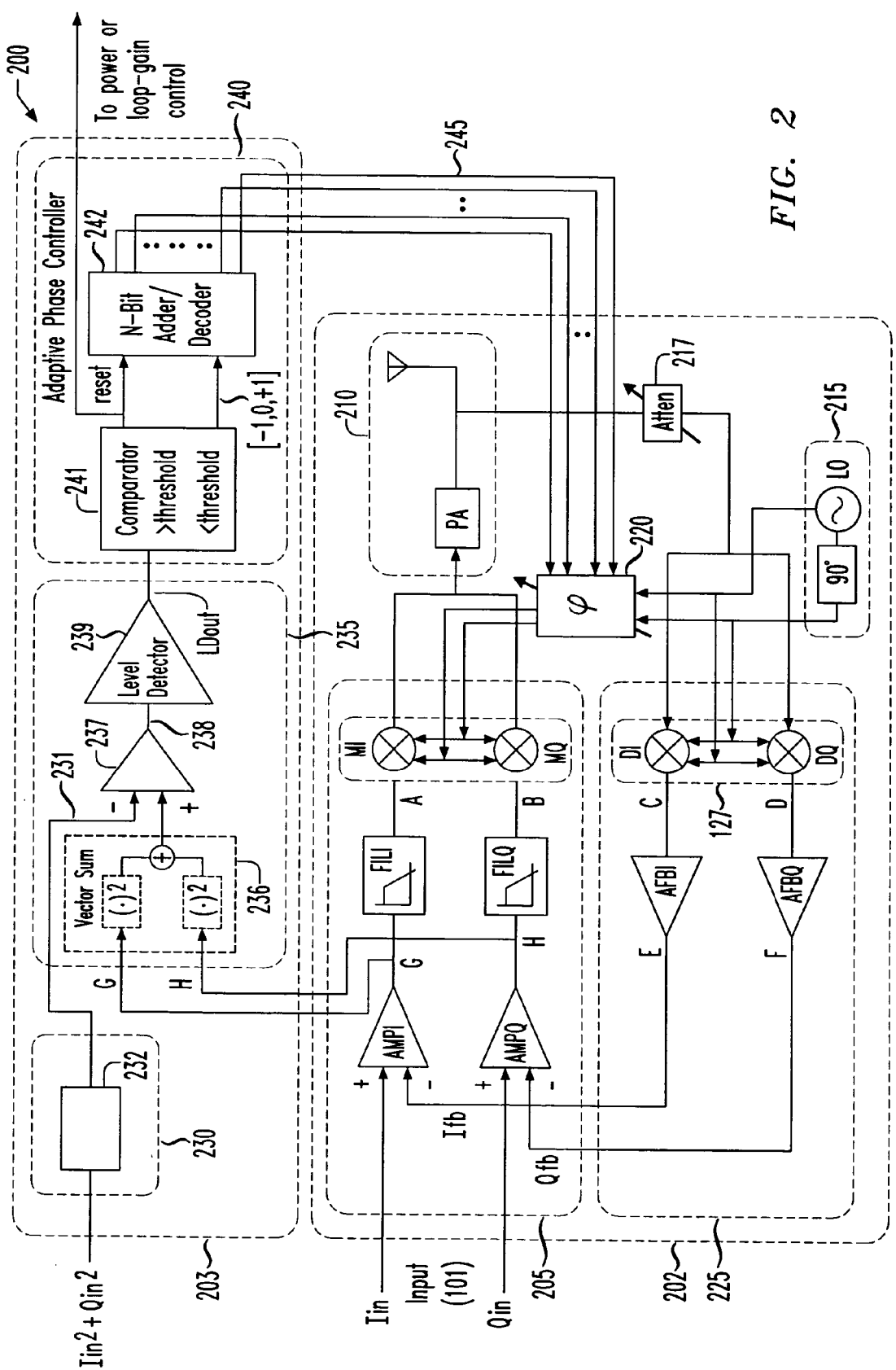
FIG. 2 illustrates a system diagram of an embodiment of a transmitter that includes an embodiment of an adaptive phase controller employed in an alternative implementation of distortion extraction and constructed in accordance with the principles of the present invention.

Turning now to FIG. 2, illustrated is a system diagram of an embodiment of a transmitter, generally designated 200, that includes an embodiment of an adaptive phase controller 240 employed in an alternative implementation of distortion extraction and constructed in accordance with the principles of the present invention. The transmitter 200 employs in-phase and quadrature phase input and feedback signals and includes a transmit portion 202 and an alternative distortion extracting portion 203. The transmit portion 202 includes an input section 205, a power amplifier section 210, a feedback section 225, a local oscillator section 215, a digitally controlled phase shifter 220 and a feedback attenuator 217. General operation of the transmit portion 202 is the same as was discussed with respect to the transmit portion 102 shown in FIG. 1.

The alternative distortion extracting portion 203 includes a digital signal processor (DSP) section 230 that provides a scaled polar vector summation 231 of in-phase and quadrature phase input signals Iin, Qin, a level detecting section 235 that provides an output LDout and an adaptive phase controller 240 that provides a phase control signal 245 to the digitally controlled phase shifter 220. The DSP section 230 includes a scaling factor 232, created by the DSP, to provide the scaled polar vector summation 231. The level detecting section 235 includes a vector summation circuit 236, an error amplifier 237 that provides an error signal 238 and a level detector 239 that provides an output LDout. The adaptive phase controller 240 includes a comparator 241 employing a threshold level TL and an N-bit adder/decoder 242 that provides the phase control signal 245.

The error amplifier 237 subtracts the scaled polar vector summation 231 of the in-phase and quadrature phase input signals Iin, Qin from the output signal of the vector summation circuit 236. This action thereby yields the error signal 238 that effectively contains only a distortion signal created by the power amplifier PA. Operation of the adaptive phase controller 240 is analogous to the adaptive phase controller 140, discussed with respect to FIG. 1, in adjusting a phase substantially to remove this distortion.

Figure 3:
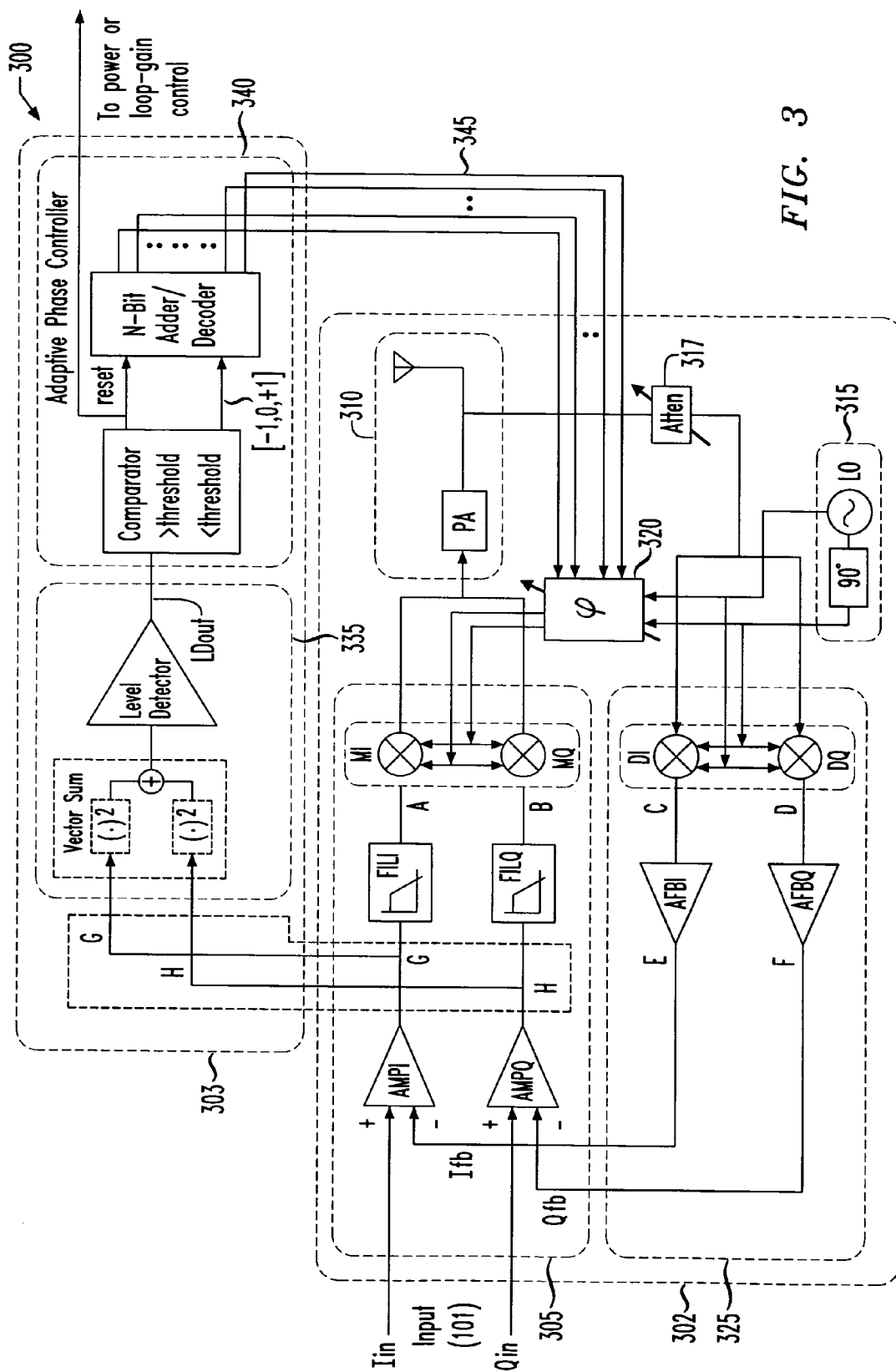
FIG. 3 illustrates a system diagram of an embodiment of a transmitter that includes an embodiment of an adaptive phase controller employed in an implementation of error indication and constructed in accordance with the principles of the present invention.

Turning now to FIG. 3, illustrated is a system diagram of an embodiment of a transmitter, generally designated 300, that includes an embodiment of an adaptive phase controller 340 employed in an implementation of error indication and constructed in accordance with the principles of the present invention. The transmitter 300 employs in-phase and quadrature phase signals and includes a transmit portion 302 and an error indicating portion 303. The transmit portion 302 includes an input section 305, a power amplifier section 310, a feedback section 325, a local oscillator section 315, a digitally controlled phase shifter 320 and a feedback attenuator 317. General operation of the transmit portion 302 is the same as was discussed with respect to the transmit section 102 of FIG. 1.

The error indicating portion 303 includes a level detecting section 335 that provides an output LDout proportional to the magnitude of a vector summation of an error signal and the adaptive phase controller 340 that provides a phase control signal 345 to the digitally controlled phase shifter 320. The higher wanted and error signals occur at nodes G and H representing a phase error between input and feedback in-phase and quadrature phase signals. The in-phase signals consist of input and feedback signals Iin, Ifb, and the quadrature phase signals consist of Input and feedback signals Qin, Qfb. In the illustrated embodiment, operation of the level detecting section 335 and the adaptive phase controller 340 are analogous to the level detector 135 and the adaptive phase controller 140, discussed with respect to FIG. 1, in adjusting a phase to substantially remove this phase error.

Figure 4:
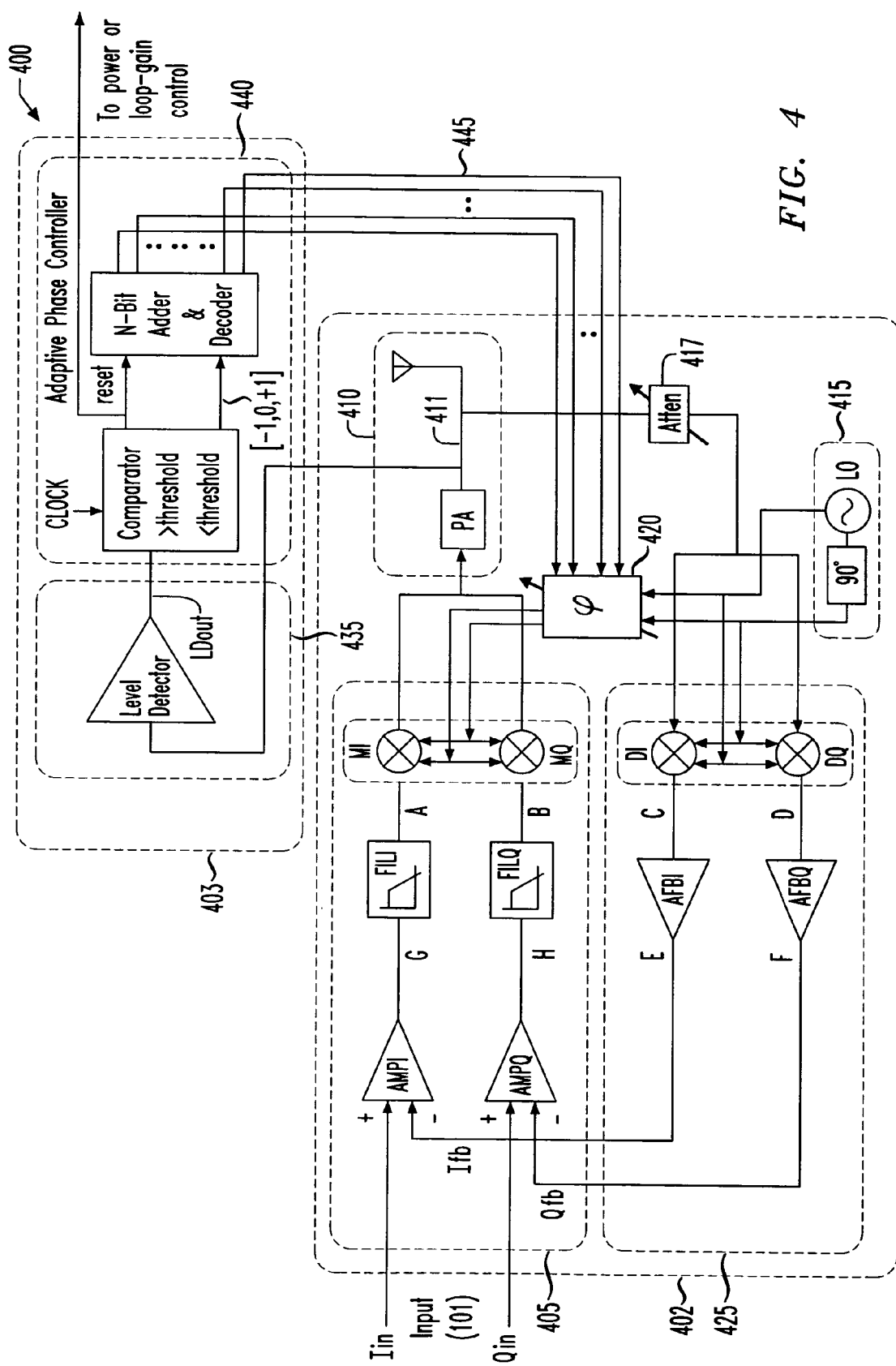
FIG. 4 illustrates a system diagram of an embodiment of a transmitter that includes an embodiment of an adaptive phase controller employed in an alternative implementation of error indication and constructed in accordance with the principles of the present invention.

Turning now to FIG. 4, illustrated is a system diagram of an embodiment of a transmitter, generally designated 400, that includes an embodiment of an adaptive phase controller 440 employed in an alternative implementation of error indication and constructed in accordance with the principles of the present invention. The transmitter 400 employs in-phase and quadrature phase input and feedback signals and includes a transmit portion 402 and an alternative error indicating portion 403. The transmit portion 402 includes an input section 405, a power amplifier section 410 having a transmit output 411, a feedback section 425, a local oscillator section 415, a digitally controlled phase shifter 420 and a feedback attenuator 417. General operation of the transmit portion 402 is the same as was discussed with respect to the transmit portion 102 of FIG. 1.

The alternative error indicating portion 403 includes a level detecting section 435 that provides an output LDout proportional to wanted and error signals contained in the transmit output 411 and the adaptive phase controller 440 that provides a phase control signal 445 to the digitally controlled phase shifter 420. In the illustrated embodiment, it is recognized that the transmit output 411 contains substantially the same error information that is contained between the nodes G and H. Moving the error indication to the transmit output 411 eliminates the requirement to provide a vector summation at a baseband frequency, thereby further simplifying the system structure. An error detection point for the transmit output 411 may employ a voltage or current sensor or a directional coupler. An advantage of this embodiment is that a power detector or an envelope detector used for power control and an RF error indicator can share the same hardware. As before, operation of the adaptive phase controller 440 is analogous to the adaptive phase controller 140, discussed with respect to FIG. 1, in adjusting a phase to substantially remove this phase error.

Figure 5:
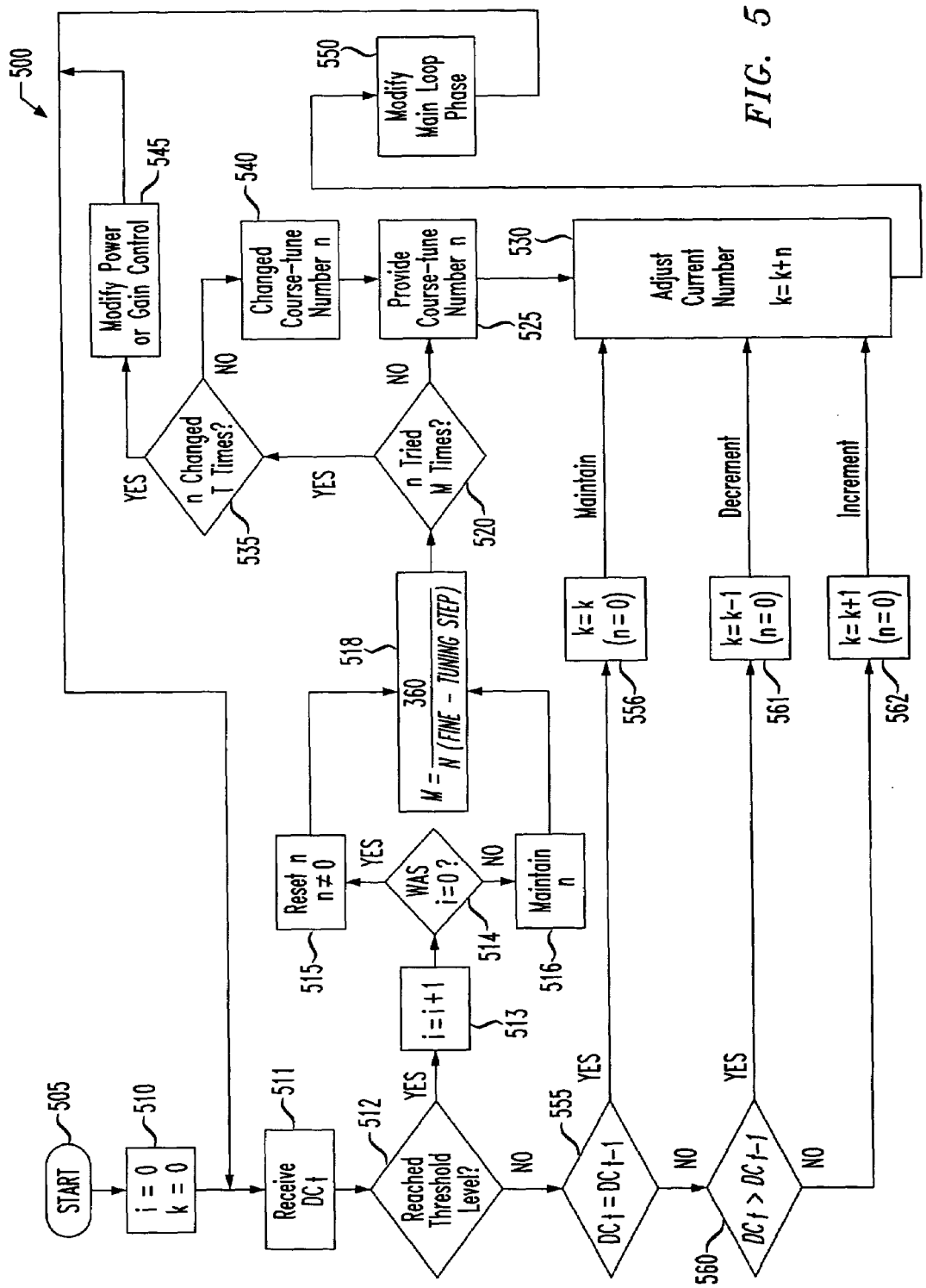
FIG. 5 illustrates a flow diagram of a method of controlling a phase employing a threshold level carried out in accordance with the principles of the present invention.

Turning now to FIG. 5, illustrated is a flow diagram of a method of controlling a phase employing a threshold level, generally designated 500, carried out in accordance with the principles of the present invention. The method 500 may be employed with distortion extraction or error indication in an operating transmitter using in-phase and quadrature phase input and feedback signals. In a step 505, the method 500 starts with a pre-stored loop phase from a previous transmitter operation. Then, a threshold indicator i representing the number of times that a threshold level has been reached, and a fine-tuning indicator k representing the number of fine-tuning iterations are set to zero in a step 510.

A comparison signal $DC_t$ is received at a time t in a step 511. In a first decisional step 512, it is determined whether the comparison signal $DC_t$ has reached the threshold level. If the comparison signal $DC_t$ is greater than or equal to the threshold level, the method 500 employs a coarse-searching mode using a predefined coarse-tuning number n, which indicates a search step size that is N times a fine-tuning step. This allows a coarse tuning of phase employing larger tuning steps.

For this case, the threshold indicator i is increased by one in a step 513, and a second decisional step 514 determines if the threshold indicator i was an initial value (i=0). If the threshold indicator i was the initial value, the course-tuning number n is reset to a non-zero value in a step 515. The coarse-searching mode provides a reset signal that may employ a number of course increment iterations M, which may be defined as:

$$M = \frac{360}{N(\text{fine-tuning step})},$$

in a step 518. The number of course increment iterations M is typically no more than about 20, in the illustrated embodiment. If the threshold indicator i was not the initial value, the course-tuning number n is maintained in a step 516, and the number of course increment iterations M is determined in the step 518, as before.

In a third decisional step 520, it is determined whether the course tuning number n has been tried a total number of course increment iterations M. If the number of course increment iterations M has not been tried, the current course tuning number n is provided in a step 525 and a current number corresponding to the phase is adjusted in a step 530. If the total number of course increment iterations M has been tried as determined in the third decisional step 520, a fourth decisional step 535 determines whether the number of changes in the ciurse-tuning number n has exceeded a predefined limit T. The predefined limit T sets an upper limit on the number of times that the course-tuning number n may be changed.

If the predefined limit T has not been exceeded in the fourth decisional step 535, the course-tuning number n is changed in a step 540 and provided in the step 525 to adjust the current number in the step 530. If the predetermined limit T has been exceeded in the fourth decisional step 535, it is assumed that an abnormal work status is not the result of an improper phase setting. In this situation, a modification of the power or gain control is required in a step 545, such that the comparison signal $DC_t$ becomes less than the threshold value.

If in the first decisional step 512 it is determined that the comparison signal $DC_t$ is less than the threshold level, a fifth decisional step 555 determines if the current comparison signal $DC_t$ is equal to a previous comparison signal $DC_{t-1}$. If the current and previous comparison signals $DC_t$, $DC_{t-1}$ are equal, the fine-tuning indicator k representing the number of fine-tuning iterations remains unchanged in a step 556 and the current number in the step 530 is just maintained. If the current and previous comparison signals $DC_t$, $DC_{t-1}$ are not equal in the fourth decisional step 555, it is determined in a sixth decisional step 560 whether the current comparison signal $DC_t$ is greater than the previous comparison signal $DC_{t-1}$.

If the current comparison signal $DC_t$ is greater than the previous comparison signal $DC_{t-1}$, the fine-tuning indicator k is decreased by one (k=k−1) in a step 561, and a vernier signal is provided that decrements the current number by one fine-tuning step in the step 530. If the current comparison signal $DC_t$ is less than the previous comparison signal $DC_{t-1}$, the fine-tuning indicator k is increased by one (k=k+1) in a step 562, and the vernier signal increments the current number by one fine-tuning step in the step 530. Maintaining, decrementing or incrementing the current number in the step 530 corresponds to adjusting a phase associated with modifying the main loop phase in the step 550. The method 500 ends when the transmitter is no longer operational.

While the method disclosed herein has been described and shown with reference to particular steps performed in a particular order, it will be understood that these steps may be combined, subdivided, or reordered to form an equivalent method without departing from the teachings of the present invention. Accordingly, unless specifically indicated herein, the order and/or the grouping of the steps are not limitations of the present invention.

Although the present invention has been described in detail, those skilled in the art should understand that they can make various changes, substitutions and alterations herein without departing from the spirit and scope of the invention in its broadest form.

What is claimed is:

1. An adaptive phase controller employing a threshold level, comprising:
    a comparator configured to receive a comparison signal representing a phase and provide a vernier signal based on comparing first and second samples of said comparison signal when said comparison signal is below said threshold level and provide a reset signal when said comparison signal reaches said threshold level; and
    an adder/decoder coupled to said comparator and configured to reset a current number of the adder/decoder to a non-zero reset number upon receiving said reset signal and configured to adjust said current number corresponding to said phase based on said vernier signal when said vernier signal is received.

2. The adaptive phase controller as recited in claim 1 wherein said adder/decoder is configured to increment said current number when said first sample is greater than said second sample.

3. The adaptive phase controller as recited in claim 1 wherein said adder/decoder is configured to decrement said current number when said first sample is less than said second sample.

4. The adaptive phase controller as recited in claim 1 wherein said adder/decoder is configured to maintain said current number when said first sample is equal to said second sample.

5. The adaptive phase controller as recited in claim 1 wherein said non-zero reset number is determined empirically.

6. A method of controlling a phase employing a threshold level, comprising:
    receiving a comparison signal;
    providing a vernier signal based on comparing first and second samples of said comparison signal when said comparison signal is below said threshold level and providing a reset signal when said comparison signal reaches said threshold level;
    adjusting a current number to a non-zero reset number if said reset signal is provided; and
    adjusting said current number corresponding to said phase based on said vernier signal when said vernier signal is received.

7. The method as recited in claim 6 wherein said adjusting includes incrementing said current number when said first sample is greater than said second sample.

8. The method as recited in claim 6 wherein said adjusting includes decrementing said current number when said first sample is less than said second sample.

9. The method as recited in claim 6 wherein said adjusting includes maintaining said current number when said first sample is equal to said second sample.

10. The method as recited in claim 6 wherein said non-zero reset number is determined empirically.

11. A transmitter, comprising:
    an input section that receives in-phase and quadrature phase input and feedback signals and provides in-phase and quadrature phase output signals;
    a feedback section that provides in-phase and quadrature phase feedback signals to said input section;
    a power amplifier that employs said input and feedback sections;
    a local oscillator section that is coupled to said feedback section;
    a digitally controlled phase shifter that is coupled to said input and local oscillator sections; and
    an adaptive phase controller that employs a threshold level and is coupled to said digitally controlled phase shifter, including:
    a comparator that receives a comparison signal representing a phase between said input and output signals and provides a vernier signal based on comparing first and second samples of said comparison signal when said comparison signal is below said threshold level and provides a reset signal when said comparison signal reaches said threshold level; and
    an adder/decoder, coupled to said comparator, that resets a current number of the adder/decoder to a non-zero reset number upon receiving said reset signal and adjusts said current number corresponding to said phase based on said vernier signal when said vernier signal is received.

12. The transmitter as recited in claim 11 wherein said adder/decoder increments said current number when said first sample is greater than said second sample.

13. The transmitter as recited in claim 11 wherein said adder/decoder decrements said current number when said first sample is less than said second sample.

14. The transmitter as recited in claim 11 wherein said adder/decoder maintains said current number when said first sample is equal to said second sample.

15. The transmitter as recited in claim 14 wherein said non-zero reset number is determined empirically.

\* \* \* \* \*